United States Patent [19]

Anderson, Jr.

[11] Patent Number: 4,460,837

[45] Date of Patent: Jul. 17, 1984

[54] FAULT TOLERANT ANALOG SELECTOR CIRCUIT

[75] Inventor: Robert L. Anderson, Jr., Salem, Oreg.

[73] Assignee: August Systems, Tigard, Oreg.

[21] Appl. No.: 387,927

[22] Filed: Jun. 14, 1982

[51] Int. Cl.[3] .......................... G06G 7/12; H03K 5/22

[52] U.S. Cl. .................................... 307/355; 307/357; 307/494; 307/498; 328/137; 328/147

[58] Field of Search ................................ 307/491-494, 307/355, 53, 57, 498; 328/147, 137

[56] References Cited

U.S. PATENT DOCUMENTS

| | | | |
|---|---|---|---|
| 3,492,588 | 1/1970 | Woodward, Jr. | 307/357 |
| 3,758,867 | 9/1973 | Schulz | 328/137 |
| 4,001,605 | 1/1977 | Thomas et al. | 328/147 |
| 4,092,578 | 5/1978 | Fabian | 307/355 |

*Primary Examiner*—Stanley D. Miller
*Assistant Examiner*—B. P. Davis
*Attorney, Agent, or Firm*—Thomas E. Schatzel

[57] ABSTRACT

An analog selector circuit for providing an analog output signal of a value approximate to the median value of the analog input signals, having a plurality of comparator means equal to the number of analog input signals, each comparator means being connected to receive one of the input signals and comparing the received signal with the analog output signal of the selector circuit, a plurality of electronic control valves connected to receive the output signals from the plurality of comparator means, the valves being connected such that a number of said valves equal in number to the majority of analog input signals are connected in series to form a series combination and there are a sufficient number of such series combinations to receive all combinations of the majority of voltage output signals, and each series combination connected to receive a voltage potential input signal and providing the output signals of the series combinations to a common terminal to form the analog output signal; and a resistive network connected between the common terminal and a reference potential.

14 Claims, 3 Drawing Figures

FAULT TOLERANT ANALOG SELECTOR CIRCUIT

BACKGROUND OF THE INVENTION

1. Field of the Invention

This invention relates generally to circuits to be used in fault tolerant computing and more particularly to an analog selector circuit whereby multiple analog signals are polled to provide a highly reliable output.

2. Description of the Prior Art

Computers behave in a specified manner as long as the parameters of physical components and the speed of operation remains within specified limits. However, it has been a common experience that unexpected abnormal physical changes in component parameters do occur in all kinds of computers. They are usually called malfunctions when the changes are temporary and failures when the changes are permanent. Their effect is to cause an unspecified and disruptive change in one or more logic variables of the computer. Such a change is called a physical fault, or simply a fault when the physical nature of the fault is clear. Non-physical faults are referred to as "man-made".

The possibility of randomly occuring faults makes the user uncomfortably aware of the physical side of the computer. A fault in a computer on board a planetary spacecraft can mean loss of a mission. In commercial jets, computers are used for functions such as navigation, stability augmentation, flight control and system monitoring. While performance of these functions by the computer is not critical, the fault may require significant disruption such as a change in destination. The usual solution to the problem of a failure is to manually remove and repair the cause of the fault. The purpose of fault-tolerance is to offer an alternate solution to the fault problem in which the detection of faults and the recovery to normal operation are carried out as internal functions of the system itself.

Analog systems can be based on two different schemes for representing the data to be transmitted. In one, the data is represented by a voltage, and in the second, it is represented by a current. In any analog circuit, it is essential that accuracy and linearity be preserved.

SUMMARY OF THE PRESENT INVENTION

It is therefore an object of the present invention to provide a fault-tolerant selector circuit that will operate with analog inputs.

It is a further object to provide a selector circuit that is itself fault-tolerant.

Briefly, a preferred embodiment of the present invention includes three operational amplifiers that receive the three analog voltage inputs and compares them to the output of the selector circuit. A series parallel arrangement of field effect transistors (FET) is inserted between a power supply voltage and a load resistive network. The output of the circuit is derived from one side of the load resistive network and the other side is returned to ground. The output voltage is fed to the negative terminals of the three operational amplifiers.

An advantage of the fault-tolerant selector circuit of the present invention is that it operates with analog inputs.

Another advantage of the fault-tolerant selector circuit is that it is itself fault-tolerant when any one component of the circuit fails.

Another advantage of the fault-tolerant selector circuit is that it selects and accurately reproduces the middle value of the applied analog signals.

These and other objects and advantages of the present invention will no doubt become obvious to those of ordinary skill in the art after having read the following detailed description of the preferred embodiment which is illustrated in the various drawing figures.

IN THE DRAWING

DETAILED DESCRIPTION OF THE PREFERRED EMBODIMENT

Figure 1:
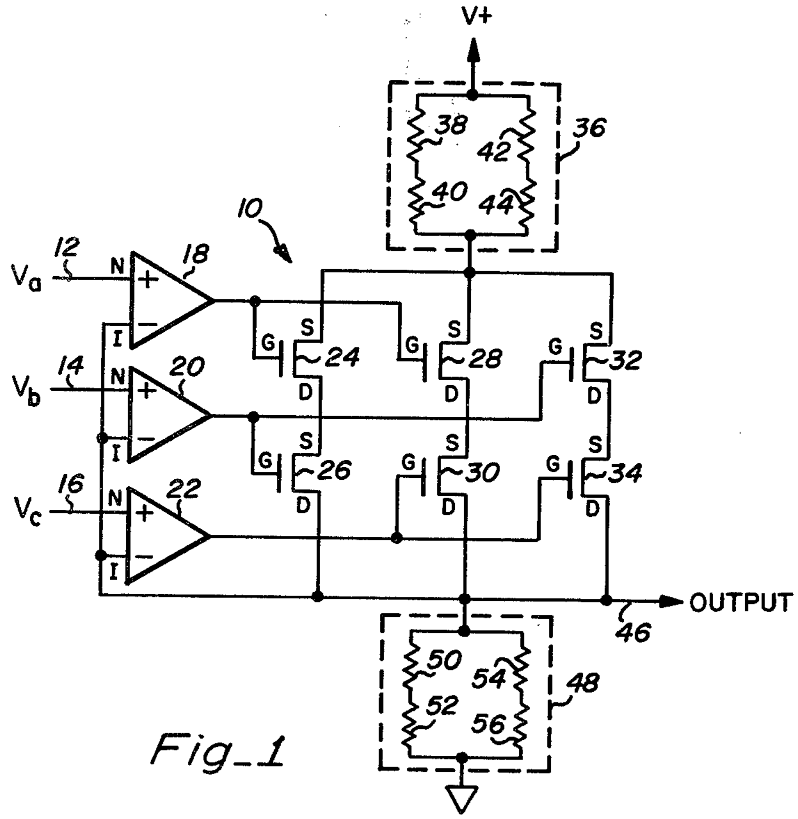
FIG. 1 is a circuit diagram illustrating the selector circuit in accordance with the present invention.

FIG. 1 illustrates a fault-tolerant analog selector circuit in accordance with the present invention and referred to by the general reference numeral 10. The selector circuit 10 receives an analog voltage $V_a$ on an input line 12, an analog voltage $V_b$ on an input line 14, and an analog voltage $V_c$ on an input line 16. The voltage input on line 12 is fed to the non-inverting input of an operational amplifier 18, the voltage input on line 14 is fed to the non-inverting input of an operational amplifier 20, and the voltage input on line 16 is fed to the non-inverting input of an operational amplifier 22.

The selector circuit 10 also includes an electronic control valve 24 connected in series with an electronic control valve 26. The output of the operational amplifier 18 is connected to the gate terminal of the electronic control valve 24. The output of the operational amplifier 20 is connected to the gate terminal of the electronic control valve 26.

The selector circuit 10 also includes an electronic control valve 28 connected in series with an electronic control valve 30. The output of the operational amplifier 18 is connected to the gate terminal of the electronic control valve 28 and the output of the operational amplifier 22 is connected to the gate terminal of the electronic control valve 30.

The selector circuit 10 also includes an electronic control valve 32 connected in series with an electronic control valve 34. The output of the operational amplifier 20 is connected to the gate terminal of the electronic control valve 32 and the output of the operational amplifier 22 is connected to the gate terminal of the electronic control valve 34.

The source terminals of the electronic control valves 24, 28, and 32 are connected to a resistive network 36 which comprises a resistor 38 connected in series with a resistor 40 together connected in parallel with a resistor 42 connected in series with a resistor 44. The resistors 38 and 42 are connected to a voltage potential V+ and the resistors 40 and 44 are connected to the source terminals of electronic control valves 24, 28 and 32.

The drain terminals of electronic control valves 26, 30 and 34 are connected to an output signal line 46. The output signal line 46 is connected to the inverting inputs of the operational amplifiers 18, 20 and 22. The output signal line 46 is also connected to a resistive network 48 which comprises a resistor 50 connected in series with a resistor 52 and together connected in parallel with a resistor 54 connected in series with a resistor 56. The resistors 50 and 54 are connected to the output signal line 46 and the resistors 52 and 56 are connected to ground potential.

The theory of operation of the selector circuit 10 is as follows. Each of the operational amplifiers 18, 20 and 22 detect a difference between the voltage of the output signal on the output signal line 46 and the voltage of each of the input signal lines 12, 14 and 16. If the input voltage exceeds the output voltage, the operational amplifiers 18, 20 and 22 will generate a high output. When the input voltage is below the output voltage then the operational amplifiers 18, 20 and 22 will generate a low voltage. In the event that all of the input voltages are the same, then the output voltages of the operational amplifiers 18, 20 and 22 will be close to the same. If these output voltages are too high, then all the electronic control valves will be turned on. Thus, the current flow through the resistive network 48 will increase and thereby increase the output voltage. The increased output voltage will be detected at the input to the operational amplifiers 18, 20 and 22, causing their output voltage to be reduced. This reduction in the output voltage will decrease the current flowing through the electronic control valves so that the output voltage will settle at a value close to the middle value of the input voltages $V_a$, $V_b$ and $V_c$. Similarly, when the output voltage is higher than the input voltages, the operational amplifiers will produce a lower output, thereby reducing the current flowing through the electronic control valves, and reducing the output voltage until it agrees with the mid-value of the input voltages. By this scheme, a feedback mechanism is used that detects differences between the inputs and outputs and increase or decreases current flow through the electronic control valves to maintain the output voltage equal to the mid-value of the input voltages. When all input voltages are equal and no circuit component has failed, the scheme will properly transmit the input voltage to the output.

A fault may occur where one of the input voltages $V_a$, $V_b$ or $V_c$ is different than the other two. It is necessary to analyze the selector circuit 10 where an erroneous voltage is too high and where an erroneous voltage is too low. For reasons of symmetry, it is sufficient to merely analyze the effect of $V_a$ being incorrect.

In the event that $V_a$ is higher than $V_b$ and $V_c$, then the output of operational amplifier 18 will be higher than the outputs of operational amplifiers 20 and 22. This will cause the electronic control valves 24 and 28 to represent close to a short circuit and they will have no controlling effect of the current flowing through the resistive network 48. The electronic control valve 24 is in series with electronic control valve 26 and therefore the current flowing through the series combination will be determined by electronic control valve 26 which has its gate or control terminal controlled by operational amplifier 20. Likewise, the current flowing through the series combination of electronic control valves 28 and 30 will be determined by electronic control valve 30 which has its gate connected to operational amplifier 22. The series combination of electronic control valves 32 and 34 is not controlled by the output of operational amplifier 18 and therefore there is no effect due to the incorrect input. Thus, the selector circuit 10 will produce an output having a value close to the median value of the inputs.

If $V_a$ is lower than $V_b$ and $V_c$, then the output from the operational amplifier 18 will be lower than the outputs from operational amplifiers 20 and 22. In this case, the operational amplifier 24 will limit the current flowing through the series combination of electronic control valves 24 and 26 and the electronic control valve 28 will limit the current flowing through the series combination of electronic control valves 28 and 30. Thus, the current flowing through the resistive network 48 will be determined by the current flowing through the series combination of electronic control valves 32 and 34, which are not effected by the faulty input channel.

A fault may also occur within the selector circuit 10 itself. If any one component fails and there are there valid inputs, the circuit will produce the correct output. If any one of the resistors in resistive network 48 fails in either open circuit or closed circuit manner, there will merely be a change in the impedance value which is of no importance to the operation of the circuit. The same conclusion applies for resistive network 36.

If one of the operational amplifiers fails so that its output is higher or lower than that of the others, there will be the same affect as though the input to that operational amplifier were too high or too low as previously discussed.

Finally, one of the electronic control valves may fail so that it operates in an open or closed circuit manner. If it operates in an open circuit manner, then there will be no current flow through the series combination of electronic control valves containing the faulty electronic control valve. In that event, the current flow through the resistive network 48 will be determined by the current flow through the other two series combinations of electronic control valves. If the faulty electronic control valve operates in a closed circuit manner, then the other electronic control valve in series with it will control the current flow through the series combination.

Thus, it has been shown that a fault in one channel or a fault in any one of the components of the selector circuit 10 will not cause an incorrect output.

Figure 2:
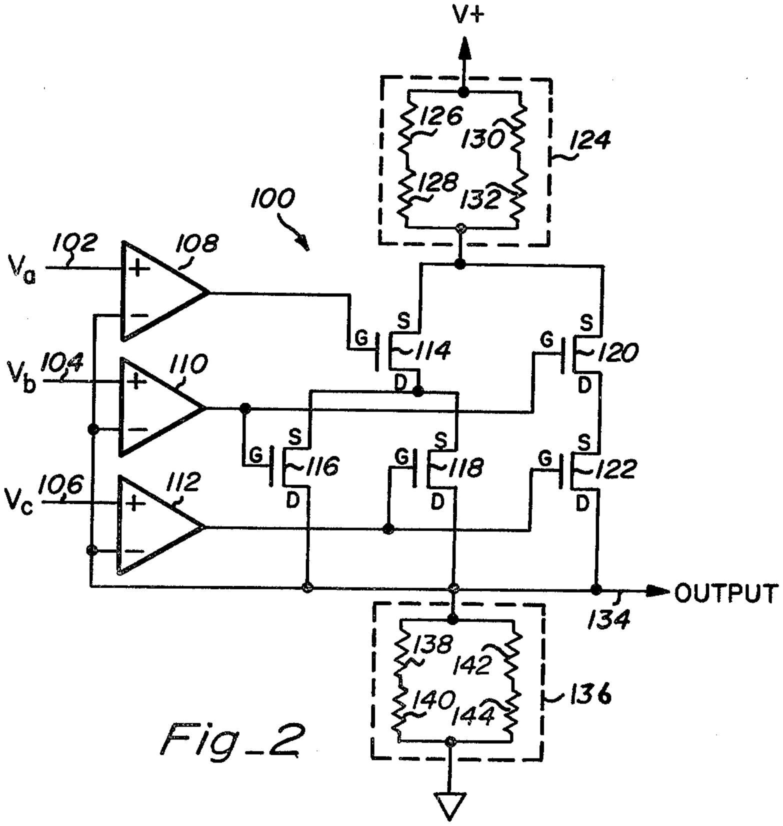
FIG. 2 is a circuit diagram illustrating an alternative embodiment of the present invention.

FIG. 2 illustrates an alternative embodiment of the fault-tolerant analog selector circuit in accordance with the present invention and referred to by the general reference numeral 100. The selector circuit 100 receives an analog voltage input $V_a$ on a line 102, an analog voltage input $V_b$ on a line 104, and an analog voltage input $V_c$ on a line 106. The voltage input 102 is fed to the non-inverting input of an operational amplifier 108, the voltage input 104 is fed to the non-inverting input of an operational amplifier 110, and the voltage input 106 is fed to the non-inverting input of an operational amplifier 112.

The selector circuit 100 also includes an electronic control valve 114 having its drain terminal connected to the source terminal of an electronic control valve 116 and to the source terminal of an electronic control valve 118. The gate terminal of the electronic control valve 114 is connected to the output of the operational amplifier 108, the gate terminal of the electronic control valve 116 is connected to the output of the operational amplifier 110 and the gate terminal of the electronic control valve 118 is connected to the output of the operational amplifier 112.

The selector circuit 100 also includes an electronic control valve 120 connected in series with an electronic control valve 122. The output of operational amplifier 110 is connected to the gate terminal of the electronic control valve 120 and the output of operational amplifier 112 is connected to the gate terminal of the electronic control valve 122.

The source terminals of the electronic control valves 114 and 120 are connected to a resistive network 124 which comprises a resistor 126 connected in series with a resistor 128 together connected in parallel with a resistor 130 connected in series with a resistor 132. The resistors 126 and 130 are connected to a voltage potential V+ and the resistors 128 and 132 are connected to the source terminals of electronic control valves 114 and 120.

The drain terminals of electronic control valves 116 and 118 and 122 are connected to an output signal line 134. The output signal line 134 is connected to the inverting inputs of the operational amplifiers 108, 110 and 112. The output signal line 134 is also connected to a resistive network 136 which comprises a resistor 138 connected in series with a resistor 140 and together connected in parallel with a resistor 142 connected in series with a resistor 144. The resistors 138 and 142 are connected to the output signal line 134 and the resistors 140 and 144 are connected to ground potential.

The operation of the selector circuit 100 is similar to that of the selector circuit 10. Structurally, the difference is that the drain terminal of electronic control valve 114 is connected to the source terminal of electronic control valves 116 and 118 rather than having two independent series combinations. However, an analysis of the circuit will reveal that a fault in one of the input signals $V_a$, $V_b$ or $V_c$ will not affect the output and a fault in one of the components of the circuit 100 will also not affect the output.

Figure 3:
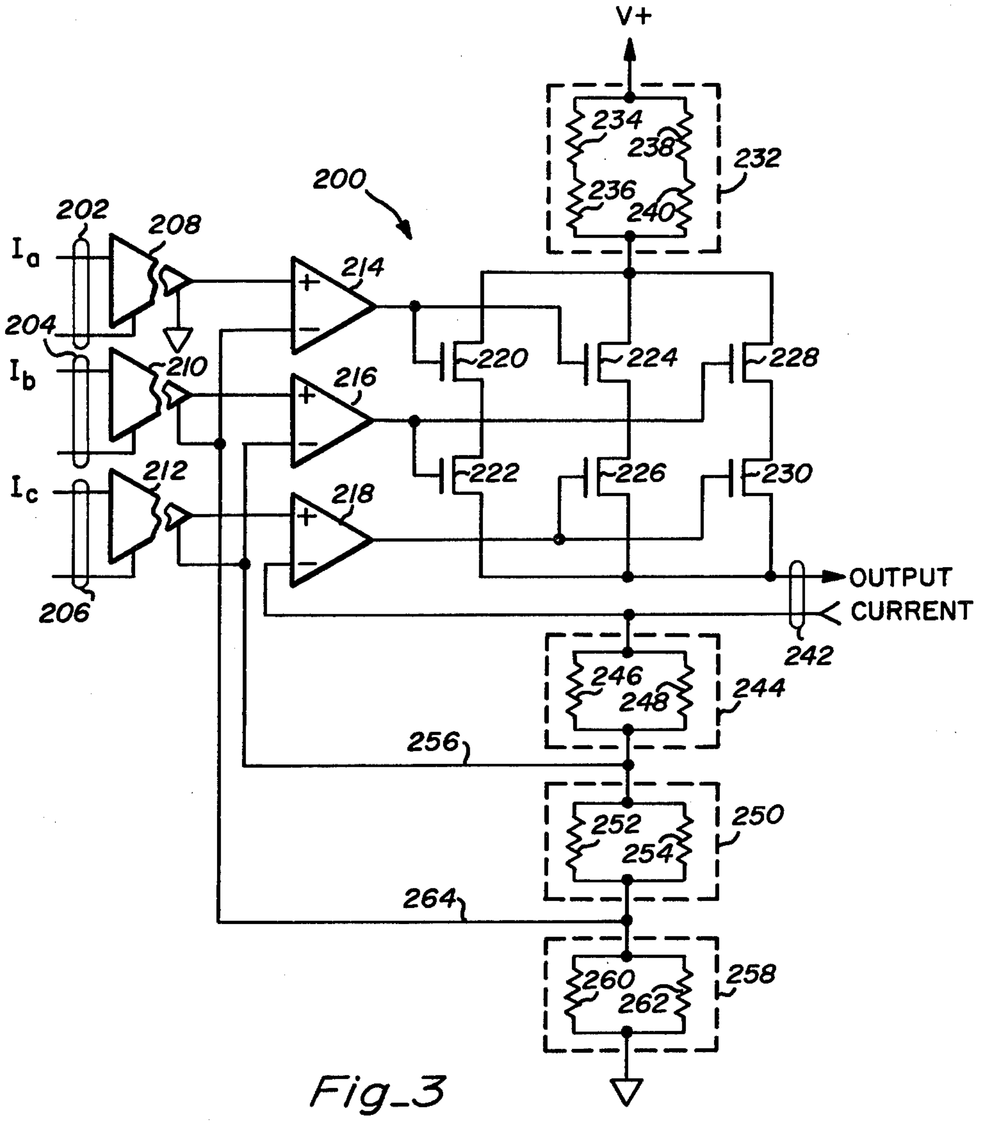
FIG. 3 is a circuit diagram illustrating a further alternative embodiment of the present invention.

FIG. 3 illustrates a further alternative embodiment of the selector circuit of the present invention and is referred to by the general reference numeral 200. The selector circuit 200 receives an analog current input signal $I_a$ on a line 202, an analog current input signal $I_b$ on a line 204 and an analog current input signal $I_c$ on a line 206. The input current on line 202 is fed to an isolating amplifier 208, the input current on line 204 is fed to an isolating amplifier 210 and the input current on line 206 is fed to an isolating amplifier 212. The output of the isolating amplifier 208 is connected to the noninverting input of an operational amplifier 214. The output of the isolating amplifier 210 is connected to the non-inverting input of an operational amplifier 216. The output of the isolating amplifier 212 is connected to the non-inverting input of an operational amplifier 218.

The selector circuit 200 includes an electronic control valve 220 connected in series with an electronic control valve 222. The gate terminal of the electronic control valve 220 is connected to the output of the operational amplifier 214 and the gate terminal of the electronic control valve 222 is connected to the operational amplifier 216.

The selector circuit 200 also includes an electronic control valve 224 connected in series with an electronic control valve 226. The gate terminal of the electronic control valve 224 is connected to the output of the operational amplifier 214. The gate terminal of the electronic control valve 226 is connected to the output of the operational amplifier 218.

The selector circuit 200 also includes an electronic control valve 228 connected in series with an electronic control valve 230. The gate terminal of the electronic control valve 228 is connected to the output of the operational amplifier 216 and the gate terminal of the electronic control valve 230 is connected to the output of the operational amplifier 218.

The source terminals of the electronic control valves 220, 224 and 228 are connected to a resistive network 232 which comprises a resistor 234 connected in series with a resistor 236 and together connected in parallel with a resistor 238 connected in series with a resistor 240. The resistors 234 and 238 are connected to a voltage potential V+. The resistors 236 and 240 are connected to the source terminals of electronic control valves 220, 224 and 228.

The drain terminals of the electronic control valves 222, 226 and 230 are connected to an output current signal line 242. The output current signal on line 242 is connected to a resistive network 244 and to the inverting input of the operational amplifier 218 which acts as a reference signal. The resistive network 244 comprises a resistor 246 connected in parallel with a resistor 248. The resistive network 244 is connected to a resistive network 250 which includes a resistor 252 connected in parallel with a resistor 254. A line 256 is connected between the resistive networks 244 and 250 and is connected to provide a reference signal at a reference input of the isolating amplifier 212 and also at the inverting input of the operational amplifier 216. The resistive network 250 is connected to a resistive network 258 which includes a resistor 260 connected in parallel with a resistor 262. The resistive network 258 is also connected to ground potential. A line 264 is connected between the resistive networks 250 and 258 and is connected to provide a reference signal at a reference input of the isolating amplifier 210 and also to the inverting input of the operational amplifier 214. The reference input terminal of the isolating amplifier 208 is connected to ground potential.

The theory of operation of the analog selector circuit 200 is as follows. The operation is similar to that for the selector circuit 10 with some modifications to handle current inputs. It is necessary to derive a voltage from the output current on the line 242 to be fed to the inverting input terminals of the operational amplifiers 214, 216 and 218. One way of doing this is to feed the output current on line 242 through a single resistive network so that a voltage is derived which can be used in a manner similar to the voltage output scheme of the selector circuit 10. However, in such a circuit, the value of the resistive network must be accurately maintained so that correct correspondence between the output current and the detected voltage is achieved. If the value of the resistive network were to change, then there would not be a correct correspondence between the output current and the detected voltage. Since it is an object of the present invention that the selector circuit be fault tolerant where any single component fails, it is necessary to devise an alternative mechanism.

The selector circuit 200 employs the three resistive networks 244, 250 and 258 connected in series. The operational amplifiers 214, 216 and 218 are then referenced to the reference signal on the line 264, the reference signal on the line 256 and the output current signal on the line 242, respectively. Since the voltage across the resistive networks 244 and 250 are not referenced to ground, it is necessary that the isolating amplifiers 208, 210 and 212 be placed in each input path so that the operational amplifiers 214, 216 and 218 may be operated relative to an arbitrary ground, local to each channel.

The selector circuit 200 achieves fault tolerance due to the failure of any single component since the failure of any resistor in the resistive networks 244, 250 or 258 will not affect the voltage drop across the other two resistive networks.

The selector circuit 200 could be modified to employ the electronic control valve structure of the selector circuit 100. Also, each of the selector circuts 10, 100 and 200 could be expanded to handle a greater number of inputs than three. In such a case, it would be necessary to have a number of electronic control valves connected in series equal to the majority of inputs, i.e., for five inputs there would be three electronic control valves connected in series. The number of series combinations of electronic control valves connected in parallel would then be expanded to handle all combinations of a majority of inputs and each series combination would receive a different combination of input channels.

In the preferred embodiment, the electronic control valves of each selector circuit are illustrated as comprised of field effect transistors. The circuits will also operate with NPN transistors, in which case the power output of the operational amplifiers will need to be increased over that required for field effect transistors.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. An analog selector circuit for providing an analog output signal of a value approximate to the median value of the analog input signals, the circuit comprising:

a plurality of comparator means equal in number to the number of analog input signals, each comparator means being connected to receive one of the said input signals and comparing said received analog input signal with said analog output signal of the selector circuit whereby a voltage output signal from each of the comparator means is generated that is proportional to the difference in voltage of said analog input signals and said analog output signal;

a plurality of electronic control valves connected to receive said voltage output signals from the plurality of comparator means, the valves being connected such that a number of said valves equal in number to the majority of analog input signals are connected in series to form a series combination and there are a sufficient number of such series combinations to receive all combinations of said majority of voltage output signals, and each series combination connected to receive a voltage potential input signal and providing the output signals of said series combinations to a common terminal to form said analog output signal; and a resistive network connected between said common terminal and a reference potential.

2. An analog selector circuit for providing an analog output signal of a value approximate to the median value of three analog input signals, the circuit comprising: first, second and third comparator means for comparing each of a plurality of analog input signals with an analog output for generating a voltage output signal generated that is proportional to the difference in voltage of said analog input signals and said analog output signal;

a first electronic control valve having a first source, a first drain and a first gate, connected with said voltage output signal from the first comparator means being connected to said first gate and said first source connected to receive a voltage potential source;

a second electronic control valve having a second source, a second drain and a second gate and connected with said voltage output signal from the second comparator means being connected to said second gate and said second source connected to said first drain;

a third electronic control valve having a third source, a third drain and a third gate and connected with said voltage output signal from the first comparator means connected to said third gate and said third source adapted to receive a voltage potential source;

a fourth electronic control valve having a fourth source, a fourth drain and a fourth gate and connected with said voltage output from the third comparator means connected to said fourth gate and said fourth source connected to said third drain;

a fifth electronic control valve having a fifth source, a fifth drain and a fifth gate and connected with said voltage output from the second comparator means connected to said fifth gate and said fifth source adapted to receive a voltage potential source;

a sixth electronic control valve having a sixth source, a sixth drain and a sixth gate and connected with said voltage output from the third comparator means connected to said sixth gate and said sixth source connected to said fifth drain; and a resistive network connected to said second, fourth and sixth drains and connected to receive a reference potential where said analog output is the voltage across the resistive network.

3. An analog selector circuit for providing an analog output signal close to the median value of three analog input signals, the circuit comprising:

first, second and third comparator means for comparing each of a plurality of analog input signals with an analog output signal for generating a voltage output signal that is proportional to the difference in voltage of said analog input signals and said analog output signal;

a first electronic control valve having a first source, a first drain and a first gate and connected with said voltage output signal from the first comparator means being connected to said first gate and said first source connected to receive a voltage potential source;

a second electronic control valve having a second source, a second drain and a second gate and connected with said voltage output signal from the second comparator means connected to said second gate and said second source connected to said first drain;

a third electronic control valve having a third source, a third drain and a third gate and connected with said voltage output signal from the third comparator means connected to said third gate and said third source connected to said first drain;

a fourth electronic control valve having a fourth source, a fourth drain and a fourth gate and connected with said voltage output from the second comparator means connected to said fourth gate and said fourth source adapted to receive a voltage potential;

a fifth electronic control valve having a fifth source, a fifth drain and a fifth gate and connected with said voltage output from the third comparator means connected to said fifth gate and said fifth source connected to said fourth drain; and a resistive network connected to said second, third and fifth drains and adapted to receive a ground potential where said analog output is the voltage across the resistive network.

4. An analog selector circuit for providing an analog current output signal close to the median value of the analog current input signals, the circuit comprising:

means for receiving and transforming a plurality of analog current input signals to a corresponding analog voltage;

a plurality of comparator means equal in number to the number of analog input signals to be received, each comparator means for comparing one of said corresponding analog voltage signals with one of a plurality of reference potentials where the number of reference potentials equals the number of analog input signals for generating a voltage output from each of the comparator means that is proportional to the difference in voltage of said corresponding analog voltage signal and said reference potential;

a plurality of electronic control valves connected such that a number of electronic control valves equal to the majority of analog inputs are connected in series to form a series combination, each electronic control valve being adapted to receive one of said voltage output signals from the comparator means where each electronic control valve of a series combination receives a different one of said voltage output signals and there are sufficient series combinations to receive all combinations of the majority of said voltage output signals; and a plurality of resistive networks connected in series and connected to the outputs of each of said series combinations of electronic control valves, the number of resistive networks being equal to the number of analog inputs whereby said reference potentials are measured across each of the resistive networks.

5. The analog selector circuit of claims 1 or 4 wherein the electronic control valves comprise field effect transistors.

6. The analog selector circuit of claim 2 wherein the first, second, third, fourth, fifth and sixth electronic control valves comprise field effect transistors.

7. The selector circuit of claim 3 wherein the first, second, third, fourth and fifth electronic control valves comprise field effect transistors.

8. The selector circuit of claims 1, 2 or 3 wherein the resistive network comprises a first and second resistor connected in parallel.

9. The selector circuit of claims 1, 2 or 3 wherein the resistive network comprises a first and second resistor connected in series and a third and fourth resistor connected in series and connected in parallel with said first and second resistors.

10. The selector circuit of claim 4 wherein each resistive network comprises a first and second resistor connected in parallel.

11. The selector circuit of claims 1 or 4 wherein the electronic control valves comprise NPN transistors.

12. The selector circuit of claim 2 wherein the first, second, third, fourth, fifth and sixth electronic control valves comprise NPN transistors.

13. The selector circuit of claim 3 wherein the first, second, third, fourth and fifth electronic control valves comprise NPN transistors.

14. The selector circuit of claim 4 wherein the transforming means comprise isolating amplifiers.

* * * * *